United States Patent [19] [11] Patent Number: 4,862,068
Kawashima et al. [45] Date of Patent: Aug. 29, 1989

[54] LST LOGIC CIRCUIT

[75] Inventors: Masatoshi Kawashima, Ohme; Makoto Takechi, Tokorozawa; Hiroshi Odani, Koganei, all of Japan

[73] Assignee: Hitachi, Ltd., Tokyo, Japan

[21] Appl. No.: 75,527

[22] Filed: Jul. 20, 1987

[30] Foreign Application Priority Data

Jul. 23, 1986 [JP] Japan ................. 61-171625

[51] Int. Cl.⁴ .................... G01R 31/28; G01R 15/12
[52] U.S. Cl. ................. 324/73 R; 324/158 R; 371/25; 371/15
[58] Field of Search .......... 324/73 R, 158 R; 371/20, 25, 15; 307/279, 272.1

[56] References Cited

U.S. PATENT DOCUMENTS 3,783,254  1/1974  Eichelberger ............. 307/272.1 X
4,298,980  11/1981 Hajou et al. .............. 371/25 X
4,476,431  10/1984 Blum ..................... 371/25 X
4,493,077  1/1985  Agrawal et al. ........... 371/25 X
4,553,236  11/1985 Zasio et al. .............. 371/25 X
4,701,922  10/1987 Kuboki et al. ............ 371/25

FOREIGN PATENT DOCUMENTS 0118704  9/1984  European Pat. Off. .
0173945  3/1986  European Pat. Off. .
2085171  4/1982  United Kingdom .

OTHER PUBLICATIONS

Lee; "LSSD Latch Configuration Which Required Fewer Input Changes for Both Scan In and Scan Out Operation".
IBM Technical Disclosure Bulletin; vol. 20, No. 1; Jun. 1977; pp. 265-267.
Nikkei Electronics, McGraw-Hill Apr. 16, 1979, pp. 57-79 and translation thereof.

Primary Examiner—Reinhard J. Eisenzopf
Assistant Examiner—Vinh P. Nguyen
Attorney, Agent, or Firm—Antonelli, Terry & Wands

[57] ABSTRACT

A LSI circuit having at least one combinational circuit and a latch coupled to the input side of the combinational circuit. The latch includes a switch for inhibiting the latching of either test data for testing the combinational circuit or data for a normal operation.

13 Claims, 5 Drawing Sheets

LSI LOGIC CIRCUIT

BACKGROUND OF THE INVENTION

The present invention relates to a logic integrated circuit technique and, more particularly, to a technique which may effectively be applied to the control of the input and output of data to and from a flip-flop in a LSI logic circuit, for example, a technique which may effectively be utilized for a method of divisionally diagnosing LSI logic circuits such as gate arrays.

A method of diagnosing large-scale integration circuits (LSIs) is known in which the LSI is divided into a plurality of combinational circuits and each of the combinational circuits undergoes a diagnosis.

For example, a master-slave flip-flop which consists of series connected master and slave latches is connected to each of the input and output sides of each of the combinational circuits. Test data is written into the flip-flop at the data input side and input to the combinational circuit, and the output of the combinational circuit is latched by the flip-flop at its output side. This operation is repeated and the latched output is compared with an expected value which has been obtained in advance to thereby diagnose the LSI (see "Nikkei Electronics", Nikkei McGraw-Hill, Apr. 16, 1979, pp. 57 to 63).

The above-described master-slave flip-flop for the divisional diagnosis is arranged such that data which is latched therein is output to the corresponding combinational circuit through a master latch. Further, all the master latches in the logic LSI are controlled by means of in-phase system clock signals so that they can be accessed from external terminals.

SUMMARY OF THE INVENTION

The above-described diagnostic method has been found to have the following problems. First, there is a possibility of causing an undesirable phenomenon, known as "in-phase transfer", in which data which is output from a master latch provided at the input side of a combinational circuit and which is supplied to the combinational circuit is changed by a clock used to latch data into a master latch provided at the output side of the combinational circuit. Second, in the above-described diagnostic method, the normal operation mode and the test mode are set by alternately switching over two different clocks from one to the other. Therefore, even when data for testing is desired to be latched into a flip-flop in the test mode for testing a combinational circuit, there is a possibility of a clock (system clock) for latching data in the normal operation mode being erroneously supplied to the flip-flop, which causes undesirable data to be latched. For this reason, it has heretofore been necessary to design a logic LSI while taking into consideration the logical restriction that, once the test mode is set, the system clock for latching data in the normal operation mode must be held at the low level at all times.

It is a primary object of the present invention to reduce the restriction on the logic design and facilitate the diagnosis of a LSI logic circuit.

The above and other objects and novel features of the present invention will become more apparent from the following description of the preferred embodiments thereof, taken in conjunction with the accompanying drawings.

A representative embodiment of the invention is summarized below.

A LSI logic circuit is divided into a plurality of combinational circuits, and a master-slave flip-flop which consists of series-connected master and slave latches is connected to each of the data input and output sides of each of the combinational circuits.

The master latch which constitutes the above-described master-slave flip-flop is provided with an input terminal which is supplied with an operation control signal for setting either a normal operation mode or a test mode for testing the corresponding combinational circuit in accordance with the level of the signal supplied thereto. In addition, data which is input to the flip-flop is output to the combinational circuit through the associated slave latch.

The master latch is provided with the operation control signal input terminal, so that it is possible to set either the normal operation mode or the test mode in accordance with the level of the operation control signal supplied thereto. Once the test mode is set, the normal mode clock signal for latching data in the normal operation mode is invalidated, and there is therefor no possibility of any undesirable data being latched into the flip-flop. Accordingly, it is possible to ignore the logical restriction that the normal mode clock signal must held at the low level at all times during the test mode in order to prevent any undesirable data from being latched into the flip-flop.

DESCRIPTION OF THE PREFERRED EMBODIMENTS

Figure 1:
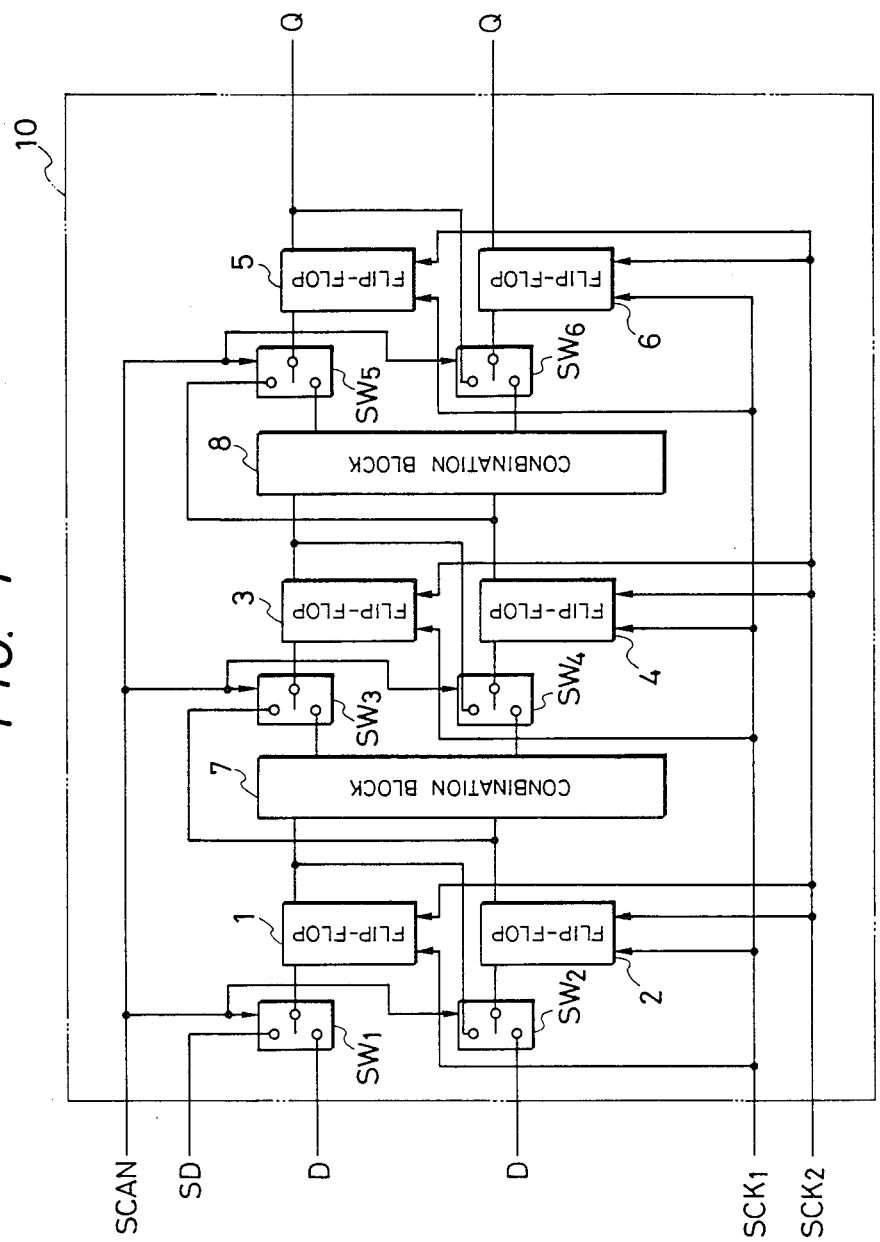
FIG. 1 is a block diagram of one embodiment of the present invention.

FIG. 1 schematically illustrates a LSI logic circuit such as a gate array to which the present invention may be applied. Circuits which are surrounded with the two-dot chain line 10 are implemented in a single semiconductor chip such as a single crystal silicon substrate, although not necessarily limited thereto.

The diagnosis of a LSI logic circuit is efficiently carried out by dividing it into a plurality of relatively small-sized combinational circuits and diagnosing each combinational circuit. In this embodiment, therefore, flip-flops 1, 2 are connected to the data input side of a combinational circuit 7, and flip-flops 3, 4 are connected to the data output side thereof. The flip-flops 3, 4 are connected to the data input side of a combinational circuit 8, and flip-flops 5, 6 are connected to the data output side thereof.

The term "combinational circuit" is used in the conventional manner to refer to any logic circuit in which the output signal is determined by the input signal. Examples of such logic circuits include an AND circuit, OR circuit, NOT circuit, NAND circuit, NOR circuit, XOR circuit and circuits obtained by combining these logic circuits (e.g., a half-adder, full adder, sign converter, encoder, decoder, etc.), together with wirings (on which input and output signals are the same).

Figure 2:
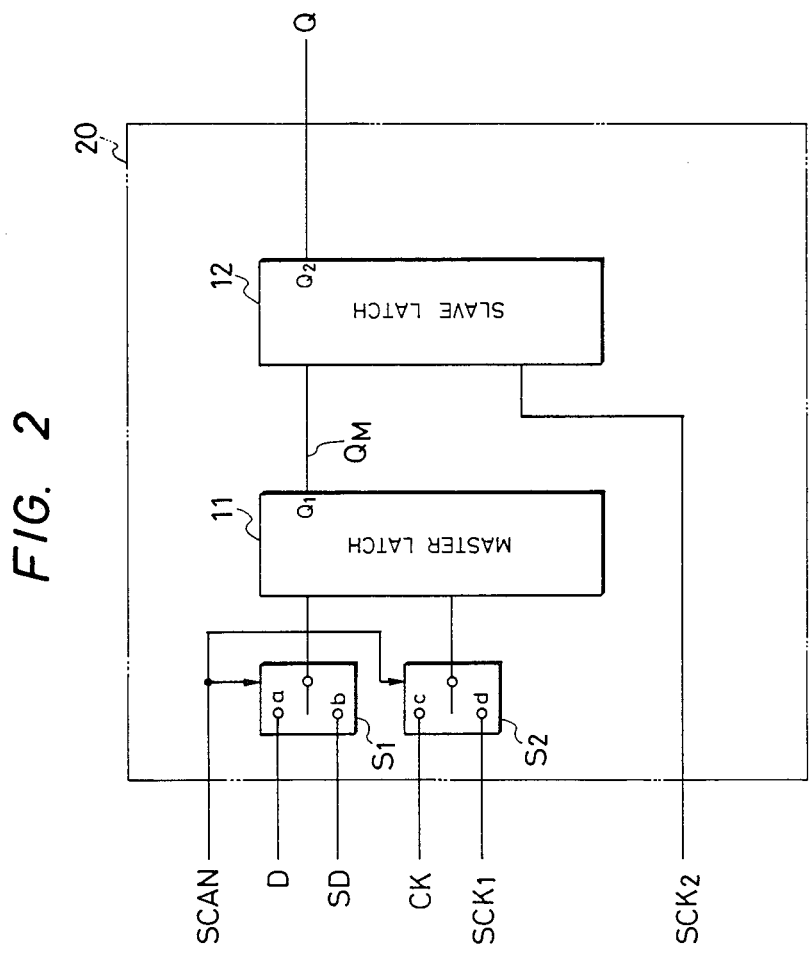
FIG. 2 is a block diagram of one of the flip-flops shown in FIG. 1.

The above-described flip-flops (denoted by the reference numerals 1 to 6) are, for example, configured as shown in FIG. 2. Referring to FIG. 2, each of the flip-flops illustrated in FIG. 1 is a master-slave flip-flop consisting of a master latch 11 and a slave latch 12. In the master latch 11, when an operation control signal SCAN is at a low level (the normal mode), switches S1, S2 are operated in such a manner that normal mode data D and a normal mode clock signal CK are validated, respectively. Although not necessarily limited thereto, in this normal mode, the normal mode data D is supplied and, when the normal mode clock signal CK is raised to a high level, the data is latched by the master latch circuit 11. When a test mode clock signals $SCK_2$ is at a low level, the data latched by the master latch 11 is held therein, whereas, when the test mode clock signals $SCK_2$ is raised to a high level, the latched data is outputted to the corresponding combinational circuit through an output terminal $Q_2$ of the slave latch 12.

When the operation control signal SCAN is at a high level (the test mode), the switches S1 and S2 are operated in such a manner that test mode data SD and a test mode clock signal $SCK_1$ are validated, respectively. Although not necessarily limited thereto, in this test mode, when the test mode data SD is supplied and the test mode clock signal $SCK_1$ is raised to a high level, test data used to test the combinational circuit is latched by the master latch 11. When, the test mode clock signal $SCK_2$ is at the low level, the data latched by the master latch 11 is held therein, whereas, when the test mode clock signal $SCK_2$ is raised to the high level, the latched test data is outputted through the output terminal $Q_2$ of the slave latch 12 in a manner similar to that in the case of the above-described normal mode. In the test mode, the test mode clock signals $SCK_1$ and $SCK_2$ are alternately raised to the high level, and desired testing data is thereby input to all the master-slave flip-flops each of which is provided at the data input side of the corresponding combinational circuit block and which consists of series-connected master and slave latches.

A method of diagnosing a LSI logic circuit is described as follows.

Referring to FIG. 1, test data for testing the combinational circuit 7 is set in the flip-flops 1 and 2. More specifically, the operation control signal SCAN supplied to the flip-flops 1 and 2 is raised to the high level, and the switches SW1 to SW6 are controlled so that the test mode data SD is input to each flip-flop. Then, the test mode clock signals $SCK_1$ and $SCK_2$ are alternately raised to the high level, and the test data SD for testing the combination circuit 7 and 8 are thus successively set in the flip-flops 1, 2, 3 and 4. The test pattern set in each of the flip-flops 1, 2, 3 and 4 is supplied to the combinational circuit 7 or 8 through the associated slave latch. Then, the operation control signal SCAN is shifted to the low level to control the switches SW1 and SW6 so that the normal mode data D is input to each flip-flop. Thereafter, the test mode clock signals $SCK_1$ and $SCK_2$ are shifted to the low level, and the operation mode is thus changed to the normal mode. In the normal mode, the normal mode data clock signals CK (not shown) supplied to the flip-flops 3 and 4 is raised to the high level, and data which is delivered from the combinational circuits 7 and 8 is thereby latched by the flip-flops 3, 4 and 5, 6, respectively. Then, the operation control low level signal SCAN is raised to the high level again and the test mode clock signals $SCK_1$ and $SCK_2$ are alternately raised to the high level, and the data latched by the flip-flops 3, 4 and 5, 6 is thus read out. In this way, diagnosis of the combinational circuit blocks 7 and 8 is accomplished. It should be noted that it is also possible to diagnose the combinational circuits 7 and 8 separately from each other.

In the above-described embodiment, a LSI logic circuit is divided into a plurality of combinational circuits, and a master-slave flip-flop which consists of series-connected master and slave latches is connected to each of the data input and output sides of each combinational circuit.

Further, the master latch which constitutes each of the master-slave flip-flops is provided with an operation control signal (SCAN) input terminal for setting either the normal operation mode or the test mode for testing the combinational circuit in accordance with the level of the signal supplied thereto. Accordingly, once the test mode is set, the normal mode clock signal is invalidated, and there is therefor no chance of any undesirable data being input to the flip-flops. Thus, it is possible to eliminate the restriction on the logic design that it is necessary to hold the normal mode clock signal at the low level at all times during the test mode in order to prevent any undesirable data from being input to the flip-flops.

Further, in the above-described embodiment, data which is output from each flip-flop to the corresponding combinational circuit is delivered from the slave latch which constitutes the flip-flop, and the latches which are respectively provided at the data input and output sides of one combinational circuit are controlled by means of clocks having different timings. Accordingly, there is no chance of in-phase transfer occurring during a diagnosis, advantageously.

Although the invention has been described in terms of the foregoing embodiment, it should be clearly understood that the invention is not limited to the above-described embodiment and various changes and modifications may, of course, be made without departing from the gist of the invention.

For example, although in the above-described embodiment a LSI logic circuit is divided into two combinational circuits and a diagnosis is carried out for each of the combinational circuits, a LSI logic circuit may be divided into any appropriate number of combinational circuits according to the size of the LSI circuit.

Figure 3:
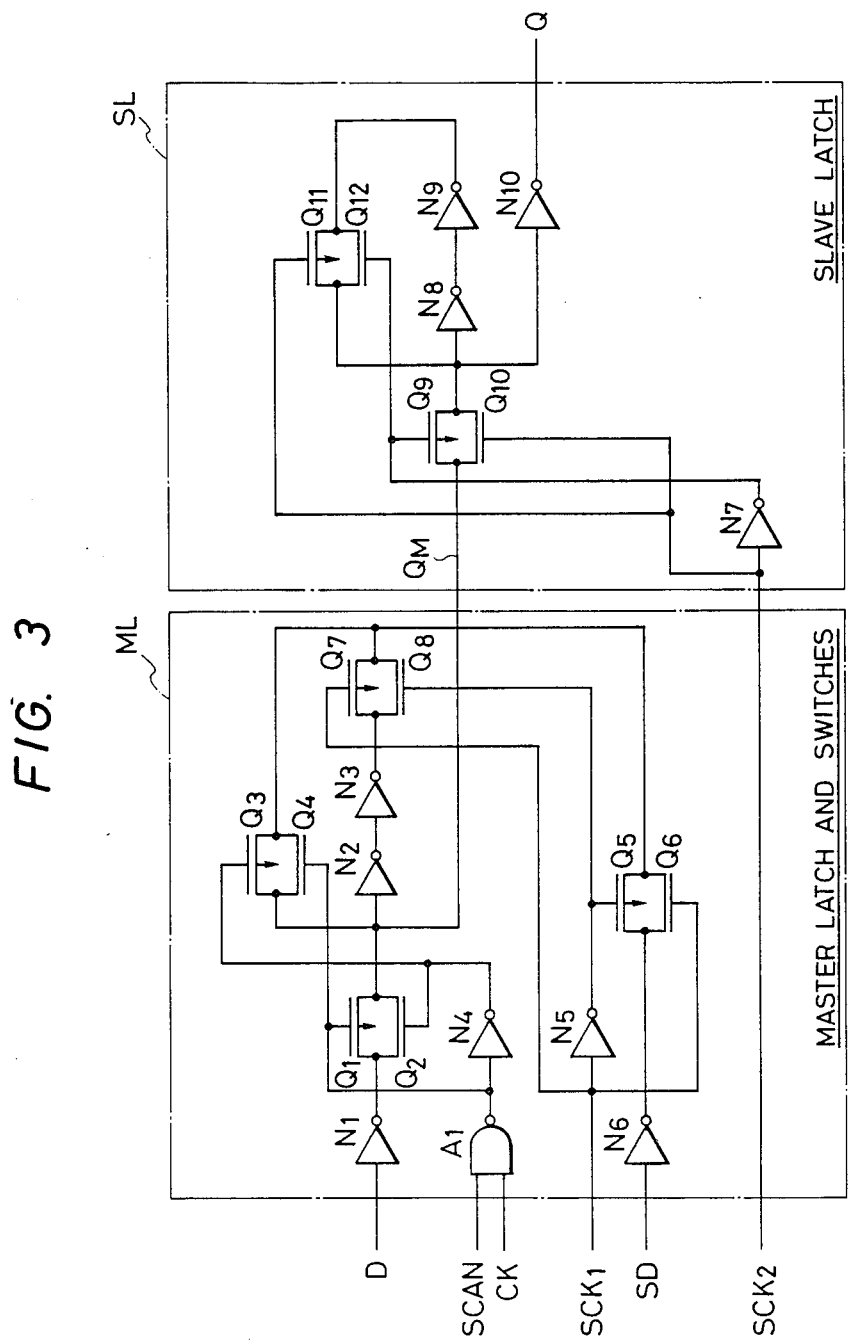
FIG. 3 is a circuit diagram of the flip-flop shown in FIG. 2.

FIG. 3 shows one implementation of the switch means S1, S2 and master-slave flip-flop shown in FIG. 2. Master latch ML comprises an inverter N1 supplied with the normal mode data D, an inverter N6 supplied with the test mode data SD, an NAND gate $A_1$ supplied with the operation control signal SCAN and the normal mode clock signal CK, inverters N2 and N3 series-connected so as to constitute a latch, and P-channel type MOSFETs Q1, Q3, Q5, Q7 and N-channel type MOSFETs Q2, Q4, Q6, Q8, etc. MOSFET pairs (Q3, Q4) and (Q7, Q8) are connected in series between the input side of the inverter N2 and the output side of the inverter N3. The output signal from the inverter N1 is supplied to the inverter N2 through a MOSFET pair (Q1, Q2). The output signal from the inverter N6 is supplied to the inverter N2 through a series connection of the MOSFET pair (Q5, Q6) and the MOSFET pair (Q3, Q4). The switching operations of the MOSFET pairs (Q1, Q2) and (Q3, Q4) are controlled by means of the NAND gate A1 and an inverter N4 which inverts the output signal from the AND gate A1. The switching operations of the MOSFET pairs (Q5, Q6) and (Q7, Q8) are controlled by means of the test mode clock signal SCK₁ and the output signal from an inverter N5 which inverts the signal SCK₁.

The slave latch SL comprises inverters N8 and N9 which are series connected so as to constitute a latch, MOSFET pairs (Q11, Q12), (Q9, Q10). The output signal from the inverter N9 is fed back to the input side of the inverter N8 through the MOSFET pair (Q11, Q12). The output signal $Q_M$ form the master latch is supplied to the inverter N8 through the MOSFET pair (Q9, Q10). The switching operations of the MOSFET pairs (Q9, Q10) and (Q11, Q12) are controlled by means of the test mode clock signal SCK₂ and the output signal from an inverter N7 which inverts the signal SCK₂.

The function tables of the master latch ML and the slave latch SL are respectively shown in TABLEs 1 and 2 below.

TABLE 1

FUNCTION TABLE OF THE MASTER LATCH (ML)

| | INPUTS | | | | | OUTPUT |
|---|---|---|---|---|---|---|
| | CK | D | SCAN | SCK₁ | SD | $Q_M$ |
| NORMAL MODE | L | X | H | L | X | $Q_{MO}$ |
| | H | H | H | L | X | H |
| | H | L | H | L | X | L |
| SCAN MODE | X | X | L | L | X | $Q_{MO}$ |
| | X | X | L | H | H | H |
| | X | X | L | H | L | L |

TABLE 2

FUNCTION TABLE OF THE SLAVE LATCH (SL)

| INPUT | OUTPUT |
|---|---|
| SCK₂ | Q |
| L | $Q_O$ |
| H | $Q_M$ |

In these tables, "H" represents a high level, "L" a low level, and "X" a state wherein the output is not affected by the level ("don't care"). "$Q_{MO}$" represents the output signal from the master latch in its previous state, while "$Q_O$" represents the output signal from the slave latch in its previous state.

As will be clear from TABLE 1, in SCAN MODE, the normal mode clock signal CK and the normal mode data D are in the "don't care" state. Accordingly, in TEST MODE such as SCAN MODE, the normal mode clock signal and the like can be invalidated. As a result, it is possible to prevent any undesirable data from being input to the flip-flop in TEST MODE. Further, the test mode data SD can be invalidated in the normal mode. As a result, it is possible to prevent any undesirable data from being input to the flip-flop in the normal mode.

Figure 4:
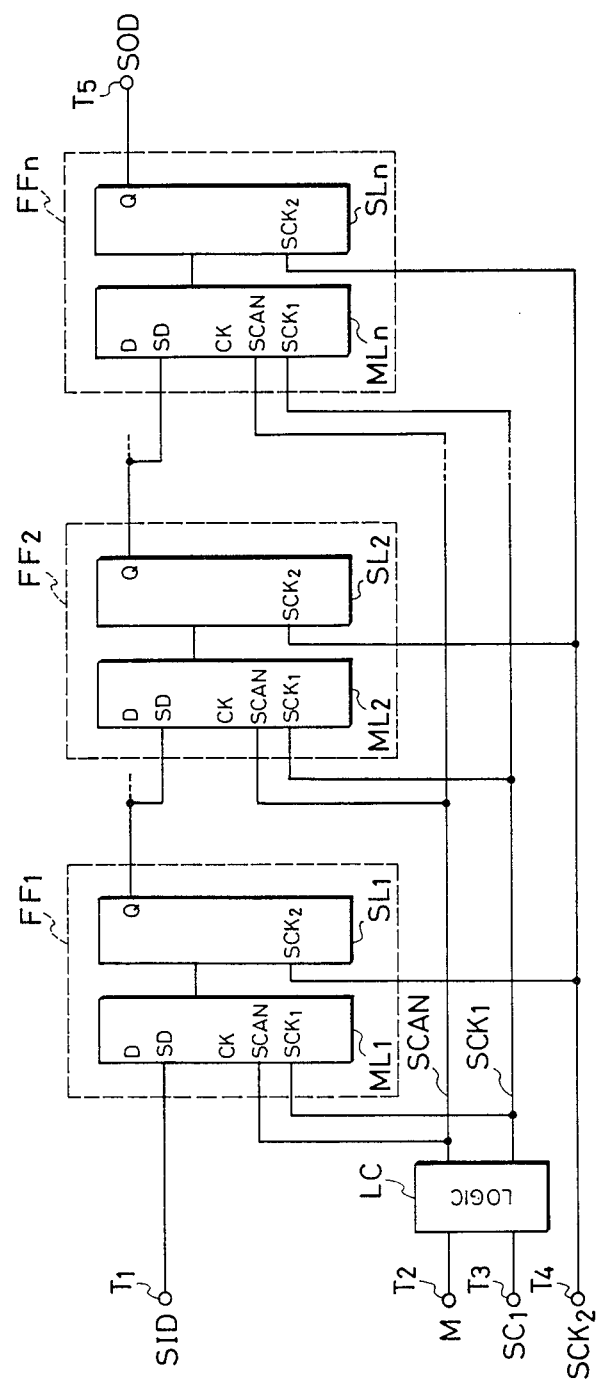
FIG. 4 is a block diagram of another embodiment of the present invention.

FIG. 4 shows an example of an arrangement in which test mode data is scanned in and out by using a plurality of flip-flops shown in FIG. 3.

A plurality of flip-flops FF1, FF2, . . . , FFn are fabricated on a single semiconductor chip together with combinational circuits (not shown).

This semiconductor chip is provided with external terminals including an input terminal T₁ for the test input data SID, an input terminal T₂ for a mode select signal M, an input terminal T₃ for the clock signal SC₁, an input terminal T₄ for the slave latch clock signal SCK₂, and an output terminal T₅ for test output data SOD. A built-in logic circuit LC produces the operation control signal SCAN and the test mode clock signal SCK₁ on the basis of the mode select signal M and the clock signal SC₁. These signals are supplied to the master latches ML1 to MLn in the flip-flops FF1 to FFn. The slave latch clock signal SCK₂ is supplied to the slave latches SL1 to SLn.

Figure 5:
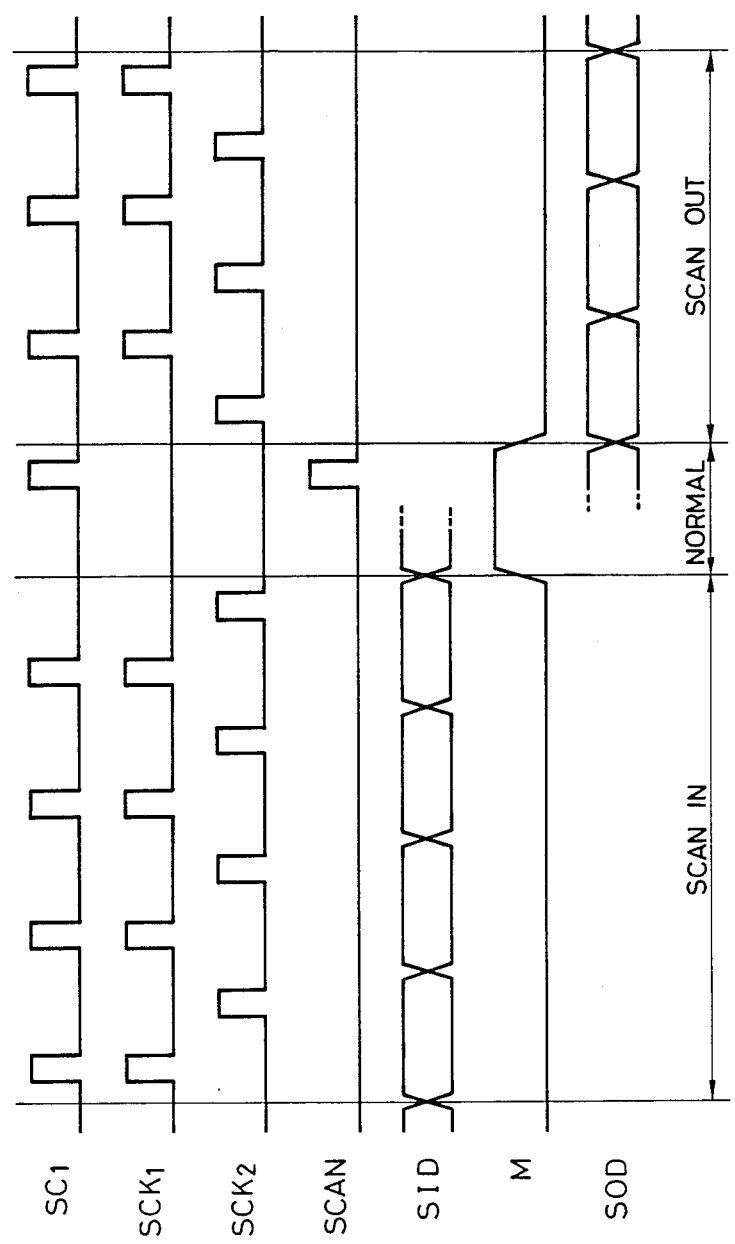
FIG. 5 is a waveform chart showing the operation of the arrangement shown in FIG. 4.

FIG. 5 is a waveform chart showing the operation of each of the circuit blocks shown in FIG. 4. The operation control signal SCAN is raised to the high level only when both the mode select signal M and the clock signal SC₁ are at the high level (SCAN=M·SC1). The test mode clock signal SCK₁ is raised to the high level only when the mode select signal M is at the low level and the clock signal SC₁ is at the high level (SCK₁=M̄·SC₁).

In the scan-in state, the test input data SID is serially inputted to the flip-flop FF1 and transferred by being successively shifted to the subsequent flip-flops.

In the normal state, the mode select signal M is raised to the high level, and reception of any test input data is thereby inhibited. Further, in the normal state, the test input data held in each flip-flop is supplied to the corresponding combinational circuit (not shown). The resultant output signal from the combinational circuit is supplied to the associated flip-flop as normal mode data D and latched by the flip-flop in synchronism with the normal mode clock signal CK.

In the scan-out state, the output signals from the combinational circuits which are held in the associated flip-flops are successively shifted to the subsequent flip-flops and thereby transferred. As a result, test output data SOD is serially delivered from the final flip-flop.

Although the invention has been described as an embodiment in which the present invention is applied to a circuit gate array, it should be clearly understood that the present invention is not limited thereto and may generally be applied to LSI logic circuits.

What is claimed is:

1. A logic circuit comprising:
   a first terminal;
   a second terminal;
   a plurality of combinational circuits disposed between the first and second terminals; and
   a plurality of flip-flops with at least one flip-flop being coupled to each of said combinational circuits, said plurality of flip-flops being coupled between said first and second terminals for shifting test data which is inputted to the flip-flop coupled to said first terminal through the coupled flip-flops to the second terminal, each flip-flop having a switching means coupled thereto which receives a control signal and which inhibits reception of a normal mode clock in response to said control signal during a period when said test data is inputted thereto.

2. A logic circuit in accordance with claim 1 wherein:

the first and second terminals are external terminals.

3. A logic circuit according to claim 2 wherein:
said master latch circuit is coupled to receive a first clock signal for controlling latching of said test data;
said slave latch is coupled to receive a second clock signal for controlling latching of said test data outputted from said master latch circuit; and
wherein levels of said first and second clock signals are alternately raised to high levels.

4. A logic circuit according to claim 1 wherein:
each flip-flop includes a master latch circuit coupled in series with a slave latch circuit.

5. A logic circuit in accordance with claim 1 wherein:
the first and second terminals are external terminals.

6. A logic circuit comprising:
a first terminal;
a second terminal;
a plurality of combinational circuits; and
a plurality of latch means coupled to said combinational circuits, said plurality of latch means being coupled between said first and second terminals for shifting test data which is inputted to the latch means coupled to said first terminal through the coupled latch means to said second terminal; and
at least one of the latch means includes an input terminal coupled to receive an output signal provided from a combinational circuit, a clock signal input terminal supplied with a clock signal for controlling latching of said output signal therein and means, responsive to a control signal, for invalidating said output signal and said clock signal during the test mode.

7. A logic circuit in accordance with claim 6 wherein:
the first and second terminals are external terminals.

8. A logic circuit according to claim 7, wherein:
each of said first and second latch circuit is comprised of a master and a slave latch circuit.

9. A logic circuit according to claim 6, wherein:
each of said plurality of latch means includes a master latch and a slave latch.

10. A logic circuit implemented in a single semiconductor chip, comprising:
a first terminal;
a second terminal;
first and second combinational circuits;
a first latch circuit having an input terminal coupled to an output of said first combinational circuit for receiving normal data or test mode data from said first combinational circuit, and an output terminal coupled to an input of said second combinational circuit;
a second latch circuit having an input terminal for receiving normal data or test mode data from an output said second combinational circuit and an output terminal coupled to said second terminal; and wherein
each of said first and second latch circuits further includes a clock signal input terminal supplied with a clock signal for controlling latching of normal data provided to the input terminal and means, responsive to a mode control signal, for invalidating the clock signal and the output signal when said mode control signal indicates a test mode; and
said latch circuits functioning to shift test data between the first and second terminals.

11. A logic circuit implemented in a single semiconductor chip comprising:
a plurality of combinational circuits;
a first terminal;
a second terminal;
a plurality of latch circuits coupled to said combinational circuits, said plurality of latch circuits being coupled between said first and second terminals;
each latch circuit including a master flip-flop circuit, a slave flip-flop circuit having an input coupled to an output of said master flip-flop circuit, an input terminal for receiving output data generated by one of the combinational circuits, a normal mode clock signal input terminal for receiving a first clock signal for controlling latching of said output data in said master flip-flop circuit, a test data input terminal for receiving test data, a test mode clock signal input terminal, coupled to said master flip-flop circuit, for controlling latching of said test data in said master flip-flop circuit;
switching means disposed between said master flip-flop circuit and said input terminal and said normal mode clock signal input terminal;
a mode control signal input terminal for receiving a control signal for controlling operation of said switching means; and
wherein said switching means is in an off state when said control signal indicates a test mode.

12. A logic circuit in accordance with claim 11 wherein:
the first and second terminals are external terminals.

13. A logic circuit according to claim 11, wherein:
each latch circuit further includes another clock input terminal coupled to said slave flip-flop.

* * * * *